(12) United States Patent
Tempel et al.

(10) Patent No.: US 6,531,359 B1
(45) Date of Patent: Mar. 11, 2003

(54) METHOD FOR FABRICATING A MEMORY CELL ARRAY

(75) Inventors: Georg Tempel, Zorneding (DE); Christoph Kutter, Dresden (DE)

(73) Assignee: Infineon Technologies AG, Munich (DE)

(*) Notice: Subject to any disclaimer, the term of this patent is extended or adjusted under 35 U.S.C. 154(b) by 28 days.

(21) Appl. No.: 09/596,420

(22) Filed: Jun. 19, 2000

Related U.S. Application Data

(63) Continuation of application No. PCT/DE98/03673, filed on Dec. 15, 1998.

(30) Foreign Application Priority Data

Dec. 18, 1997 (DE) .......................................... 197 56 601

(51) Int. Cl.[7] .................... H01L 21/336; H01L 21/3205
(52) U.S. Cl. .................... 438/257; 438/279; 438/303; 438/558; 438/586; 438/587
(58) Field of Search ................................. 438/295, 296, 438/294, 303, 404, 221, 359, 219, 554, 558, 561, 257, 279, 586, 587, 593

(56) References Cited

U.S. PATENT DOCUMENTS

| | | | |
|---|---|---|---|
| 4,467,518 A | * | 8/1984 | Bansal et al. ................ 438/153 |
| 5,084,418 A | * | 1/1992 | Esquivel et al. ............ 438/301 |
| 5,103,274 A | | 4/1992 | Tang et al. |
| 5,264,718 A | | 11/1993 | Gill |
| 5,589,413 A | | 12/1996 | Sung et al. |
| 5,661,054 A | | 8/1997 | Kauffman et al. |
| 5,661,057 A | | 8/1997 | Fujiwara |
| 5,736,442 A | | 4/1998 | Mori |
| 5,930,618 A | * | 7/1999 | Sun et al. .................... 438/240 |

FOREIGN PATENT DOCUMENTS

| | | |
|---|---|---|
| EP | 0412558 A2 | 2/1991 |
| JP | 982924 | 3/1997 |

OTHER PUBLICATIONS

"Process and Device Technologies for 16Mbit EPROMs with Large-Tilt-Angle Implanted P-Pocket Cell", Yoichi Ohsima et al., IEEE, 1990, pp. 5.2.1-5.2.4.

\* cited by examiner

*Primary Examiner*—Matthew Smith
*Assistant Examiner*—Lex H. Malsawma
(74) *Attorney, Agent, or Firm*—Laurence A. Greenberg; Werner H. Stemer; Ralph E. Locher

(57) ABSTRACT

A method for fabricating a memory cell array, in particular an EPROM or EEPROM memory cell array, includes burying insulation zones on a silicon substrate in accordance with an STI (Shallow Trench Isolation) technique, forming word lines on the insulation zones, covering the word lines with a hard mask and side wall oxides and CVD depositing an oxide or nitride laterally onto the hard mask and onto the side wall oxides to define a spacer. Spacer channels are etched into the insulation zones between adjoining word lines. An SAS (Self Aligned Source) resist mask is applied to mask each two adjacent coated word lines on mutually facing sections, including the spacer channel located between these word lines, while each two adjacent masked word lines of masked word line pairs remain unmasked on mutually facing sections. The SAS resist mask is exposed. Those regions of the insulation zones which are not covered by the SAS perforated mask are anisotropic etched, with a bottom of uncovered spacer channels being lowered down at least to a surface of the uncovered silicon substrate. The SAS perforated mask is removed to uncover a resultant structure.

22 Claims, 4 Drawing Sheets

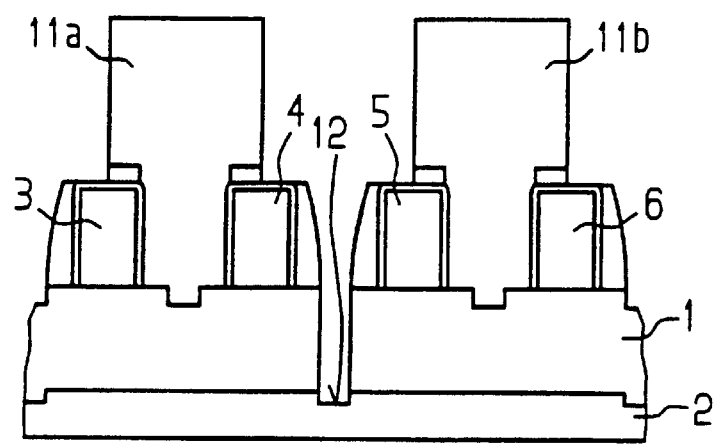
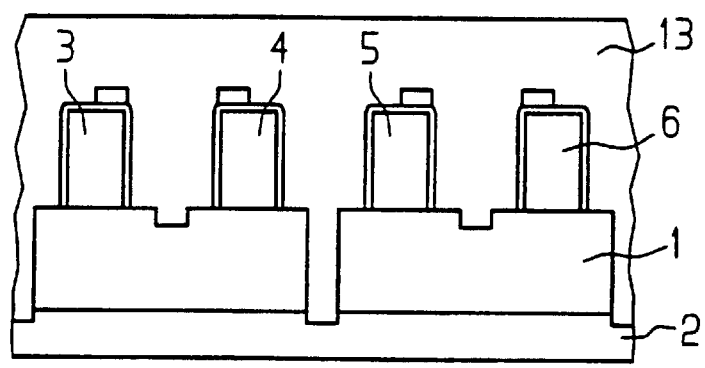
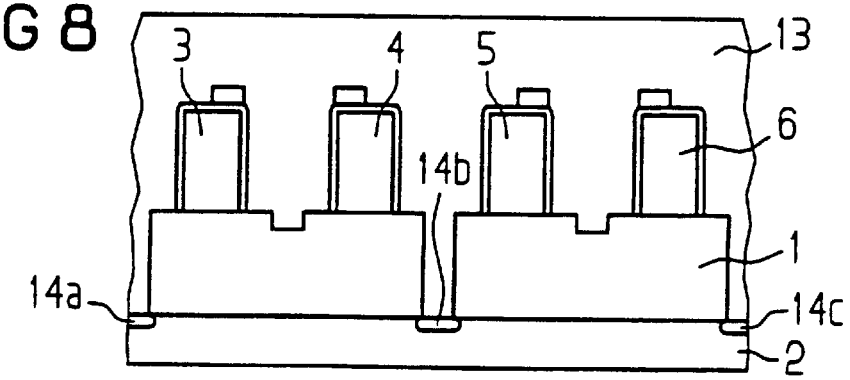

METHOD FOR FABRICATING A MEMORY CELL ARRAY

CROSS-REFERENCE TO RELATED APPLICATION

This application is a continuation of copending International Application No. PCT/DE98/03673, filed Dec. 15, 1998, which designated the United States.

BACKGROUND OF THE INVENTION

Field of the Invention

The invention relates to a method for fabricating a memory cell array, in particular an EPROM or EEPROM memory cell array, having a silicon substrate, insulation zones disposed on the silicon substrate, and word lines disposed on the insulation zones. The method includes burying the insulation zones on the silicon substrate, forming the word lines on the insulation zones, covering the word lines with a hard mask and side wall oxides and CVD deposition of preferably an oxide or nitride laterally onto the hard mask and onto the side wall oxides in order to define spacers. The spacers are etched to form spacer channels in the insulation zones between adjoining word lines. An SAS (Self Aligned Source) resist mask is applied and patterned in such a way that each two adjacent coated word lines are masked in regions, including the spacer channel located between those word lines, while each two adjacent masked word lines of masked word line pairs remain unmasked in regions, including the spacer channel lying between those word lines. The SAS resist mask is exposed and those regions of the insulation zones which are not covered by the SAS resist mask are anisotropically etched, with a bottom of uncovered spacer channels being lowered down at least to a surface of the silicon substrate, and the SAS resist mask is removed in order to uncover a resultant structure.

Such a method is disclosed in Patent Abstracts of Japan Publication number: 09082924 A, corresponding to U.S. Pat. No. 5,736,442.

In the field of memory cell arrays, there is a constant requirement for reduction of the memory cell area, in order to ensure that arrays of that type have the highest possible integration level.

One known technology for reducing memory cell area is that which goes by the name of self-aligned source construction (Self Aligned Source: SAS) and is referred to below by the abbreviation SAS. That technology is explained for the case of EPROM memories, for example, in a paper entitled "Process and Device Technologies for 16 Mbit EPROMs with Large-Tilt-Angle Implanted p-Pocket Cell", by Yoichi Ohshima et al., in International Electron Device Meeting 1990, pages 95 et. seq.

Accordingly, for the purpose of reducing memory cell area, through the use of a special photographic technique (open on the source side) the insulation, which is usually field oxide, between active zones, so-called S/D zones, and word lines is removed through the use of dry etching technology (RIE), and source zones are implanted using the same resist mask.

A further application of that technology is explained for EEPROM memories in U.S. Pat. No. 5,264,718, where special measures are taken in order to replace the otherwise customary dog bone-shaped field oxide regions by ones with rectangular contours.

In all known cases, the above-mentioned technology for reducing memory cell area is used exclusively in combination with field oxide for the insulation, since only in that way has it been possible heretofore to obtain gradual transitions in the substrate between the field oxide and previously defined diffusion zones. In that case, the doping is effected in such a way that the bare Si substrate is doped vertically through the use of conventional high-current implantation. A spacer technology is usually used in order to protect gate edges during the actual SAS etching in that process.

Lately, use has increasingly been made of STI (Shallow Trench Isolation) constructions, according to which virtually box-shaped insulation zones are buried in the Si substrate sequentially through the use of trench etching, a filling process and an etching back or polishing back process. If the STI technology is employed for the SAS technology, the vertical side walls are not doped, or are only weakly doped, at the instant of the high-current implantation, which is effected in the vertical direction. The consequence is that only very high-impedance contiguous source zones can be obtained in the fabrication of memory cell arrays through the use of that combination of the two technologies.

SUMMARY OF THE INVENTION

It is accordingly an object of the invention to provide a method for fabricating a memory cell array, which overcomes the hereinafore-mentioned disadvantages of the heretofore-known methods of this general type and which ensures that low-impedance contiguous diffusion regions can be obtained for the memory cell arrays without complicated implantation and with simultaneous integration of an insulation oxide.

With the foregoing and other objects in view there is provided, in accordance with the invention, a method for fabricating a memory cell array, in particular an EPROM or EEPROM memory cell array, which comprises burying insulation zones on a silicon substrate by applying STI (Shallow Trench Isolation) technology, forming word lines on the insulation zones, covering the word lines with a hard mask and side wall oxides, CVD depositing an oxide or a nitride laterally onto the hard mask and onto the side wall oxides to define spacers, and etching the spacers to form spacer channels in the insulation zones between adjoining word lines. The method also includes applying and patterning an SAS (Self Aligned Source) resist mask to mask each two adjacent coated word lines in regions, including the spacer channel located between the word lines, while each two adjacent masked word lines of masked word line pairs remain unmasked in regions, including the spacer channel lying between the word lines. The SAS resist mask is exposed, regions of the insulation zones not covered by the SAS resist mask are anisotropically etched and a bottom of uncovered spacer channels is lowered down at least to a surface of the silicon substrate. The SAS resist mask is removed to uncover a resultant structure, a PSG (phosphorus-doped glass) layer is deposited onto the uncovered structure, and a resultant structure is heat treated to defuse the phosphorus doping into the uncovered silicon substrate as a source doping process step.

In accordance with another mode of the invention, the removal step is followed by an aftertreatment step for the uncovered structure.

In accordance with a further mode of the invention, the etching step additionally includes overetching. In accordance with an added mode of the invention, in the etching step, the hard mask and the CVD oxide or nitride are thinned.

In accordance with an additional mode of the invention, the heat treatment step is carried out in a furnace. In accordance with yet another mode of the invention, the heat treatment step is effected through the use of RTA.

In accordance with yet a further mode of the invention, this step is followed by a step for planarizing the resultant structure. In accordance with yet an added mode of the invention, the planarization is effected through the use of CMP.

In accordance with a concomitant mode of the invention, the planarization is followed by a process for contact hole etching and filling and for metallization.

Other features which are considered as characteristic for the invention are set forth in the appended claims.

Although the invention is illustrated and described herein as embodied in a method for fabricating a memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3 to 8 are fragmentary, sectional views taken along a line III/VIII—III/VIII of FIG. 2, in the direction of the arrows, illustrating individual method steps of the method according to the invention.

DESCRIPTION OF THE PREFERRED EMBODIMENTS

Figure 1:
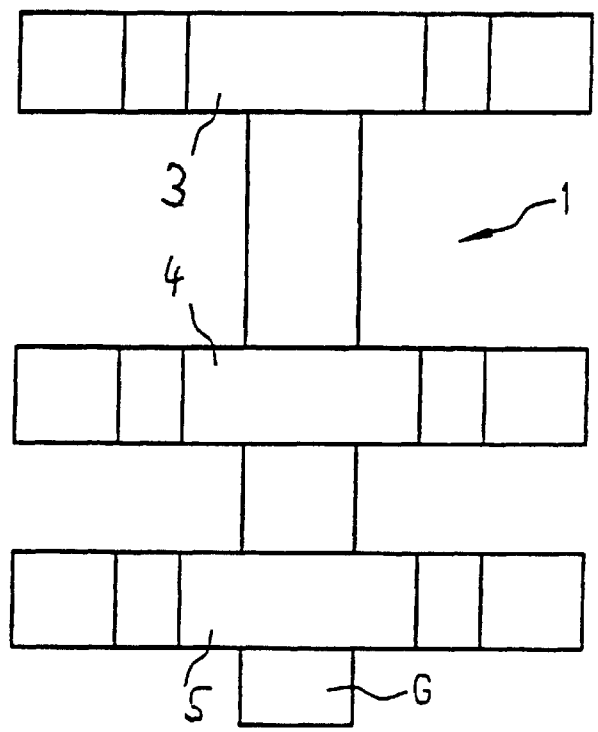
FIG. 1 is a diagrammatic, plan view of a preliminary stage of a memory cell array in which word line patterning has been effected.
Figure 2:
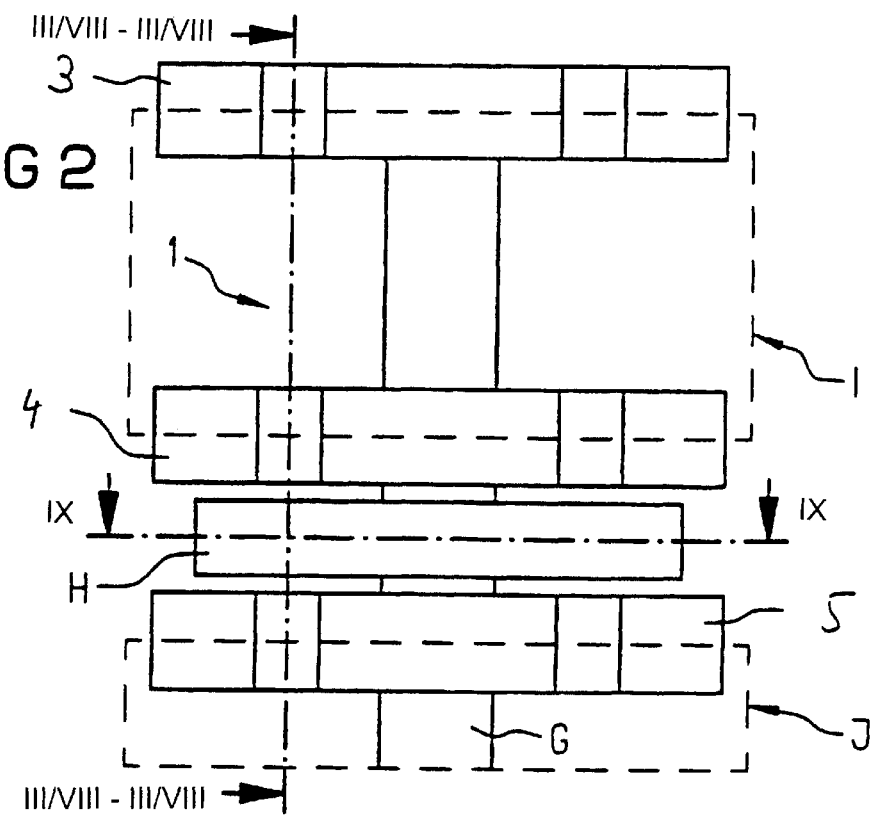
FIG. 2 is a plan view showing the structure of FIG. 1 after SAS etching has been carried out.
Figure 3:
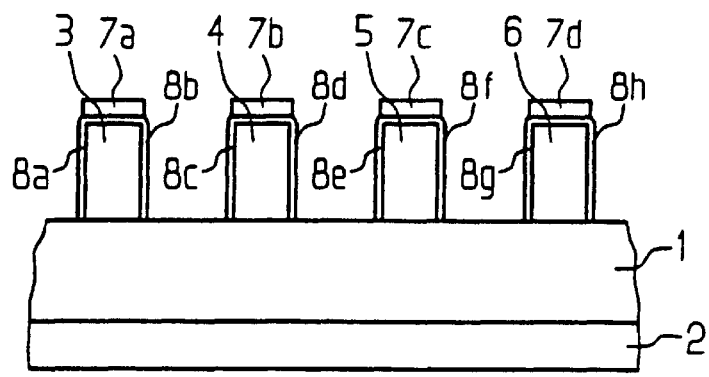

Referring now to the figures of the drawings in detail and first, particularly, to FIG. 1 thereof, there is seen a plan view of a memory cell array before a source region has been formed, while FIG. 2 shows a similar view, but with the source region having been formed. Reference symbols 3, 4 and 5 designate word line structures, while reference symbol G designates a diffusion zone. A source region (self aligned source) is designated by reference symbol H in FIG. 2. A position of an SAS mask, which is explained in detail below, is shown by broken lines in FIG. 2 and is designated by reference symbols I and J.

The method for fabricating a memory cell array according to the invention is explained in more detail below with reference to FIGS. 3 to 8, which are each sectional views taken along a line III/VIII—III/VIII of FIG. 2 and representing individual fabrication steps.

Firstly, insulation zones are buried on a silicon substrate 2 through the use of the STI (Shallow Trench Isolation) technology that has been explained in detail. One insulation zone 1 thereof is illustrated in FIGS. 3 to 9. Word lines 3, 4, 5 and 6 are formed in a conventional manner on the insulation zone 1 that has been buried on the silicon substrate 2 in this way. These word lines are thereupon covered with a hard mask 7a, 7b, 7c and 7d and with side wall oxides 8a, 8b, 8c, 8d, 8e, 8f, 8g and 8h. This covering technology belongs to the prior art just like the material used for this purpose, and it therefore needs no further explanation in the present case. The thickness of the hard mask 7a to 7d is chosen in such a way that it protects the word line material or polysilicon during the SAS etching that is explained below.

Figure 4:
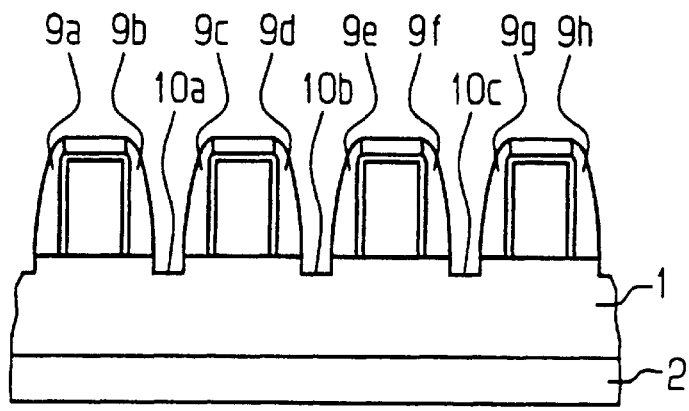

As is shown in FIG. 4, an oxide or nitride is thereupon deposited as spacers on the hard mask 7a to 7d and the side wall oxides 8a to 8h through the use of the CVD (Chemical vapor Deposition) technique. This oxide or nitride layer protects the gate-poly or cell-poly sides of the word lines. The spacers are designated by reference numerals 9a, 9b, 9c, 9d, 9e, 9f, 9g and 9h and extend from the side edges of the hard masks 7a to 7d over the side wall oxides 8a to 8h as far as the base of the word lines 3 to 6 on the insulation zone 1.

As is likewise shown in FIG. 4, the spacers bearing the reference numerals 9a, 9b, 9c, 9d, 9e, 9f, 9g and 9h are thereupon etched, and in the course thereof spacer channels are produced in a manner inherent to the process in an insulation zone between adjoining word lines 3, 4 and 4, 5 and 5, 6. These spacer channels are designated by reference numerals 10a, 10b and 10c.

Figure 5:
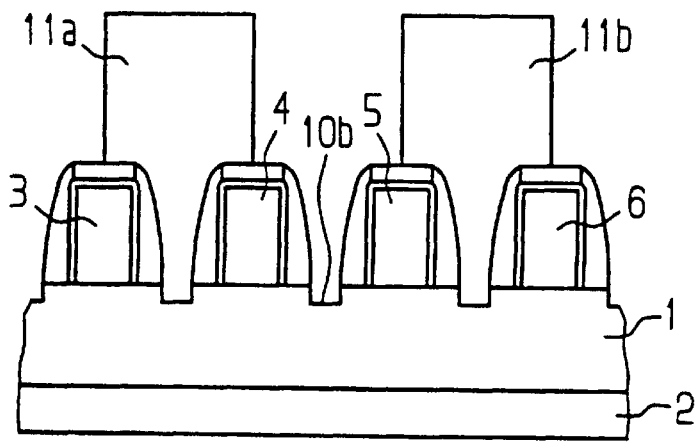

Next, as is shown in FIG. 5, an SAS (Self Aligned Source) perforated mask is applied to the structure of FIG. 4 in such a way that each two adjacent coated word lines 3, 4 and 5, 6 are masked on sections facing toward each other, including the respectively intervening spacer channels 10a and 10c, while each two of these adjacent masked word line pairs 3, 4 and 5, 6 are left unmasked on sections facing away from each other. This perforated mask is provided with reference numerals 11a and 11b in FIG. 5.

In particular, the resist mask portion 11a thus covers half of the respective hard masks 7a and 7b, or 7c and 7d, of the word lines 3, 4, or 5, 6 and the mutually facing side wall oxides 8b, 8c, or 8f, 8h thereof. The resist mask portion 11a additionally extends down to the upper surface of the insulation zone 1 between the word lines 3, 4, or 5, 6 and into the spacer channels 10a and 10c.

As is shown in FIG. 6, the next step is that the SAS resist mask 11a, 11b is exposed, proceeding from the structure of FIG. 5. As is likewise shown in FIG. 6, anisotropic etching as well as overetching of those regions of the insulation zone 1 which are not covered by the SAS perforated mask 11a, 11b is thereupon effected. In addition, the bottom of the uncovered spacer channel 10b is lowered between the two partially covered word line pairs 3, 4 and 5, 6.

As a result of this etching step, the STI filling is completely removed from these regions. It should be noted that in this case the etching has sufficient selectivity with respect to the hard masks 7a to 7d and the spacers 9a to 9h as well as with respect to the silicon substrate. The bottom of the spacer channel 10b is lowered by this etching at least down to the upper surface of the silicon substrate 2, but preferably below this surface, as is shown diagrammatically in FIG. 6 and designated by reference numeral 12.

This concludes the patterning of the memory cell array.

Following the etching step shown in FIG. 6, the structure which is thus obtained is freed of the resist mask 11a, 11b in a manner that is known per se. In addition, the structure surface is preferably subjected to an aftertreatment that is known per se.

As is shown in FIGS. 7 and 8, a source doping process then follows, as is explained below.

As is shown in FIG. 7, firstly a PSG (phosphorus-doped glass) layer is deposited onto the uncovered structure shown in FIG. 6. The PSG layer is designated by reference numeral 13 and, as is revealed by FIG. 7, covers the entire surface structure of the memory cell array of FIG. 6.

The structure as shown in FIG. 7 with the PSG layer 13 is then subjected to heat treatment through the use of a furnace process or RTA. In the course of that treatment, the phosphorus doping of the PSG layer 13 diffuses into the uncovered silicon substrate 2. In remaining parts of the structure, the deposited CVD oxide or nitride layer prevents such indiffusion. The diffusion of the phosphorus doping into the uncovered silicon substrate is designated by reference numerals 14a, 14b and 14c in FIG. 8.

The PSG layer 13 can then be planarized through the use of CMP in accordance with the prior art and thus simultaneously forms an intermediate oxide with respect to a first metal plane. The PSG layer 13 can remain on the chip which is thus formed, since an appreciable thermal budget for further outdiffusion does not occur in all of the subsequent processes.

The next step that follows is contact hole etching and filling, which is not specifically shown in the drawings since those process steps likewise belong to the prior art. Since the source exists at the level of a customary diffusion according to this method, the associated contact can be treated and positioned like any other diffusion contact.

Finally, the last method step is metallization, which is a step that likewise belongs to the prior art.

Figure 9:
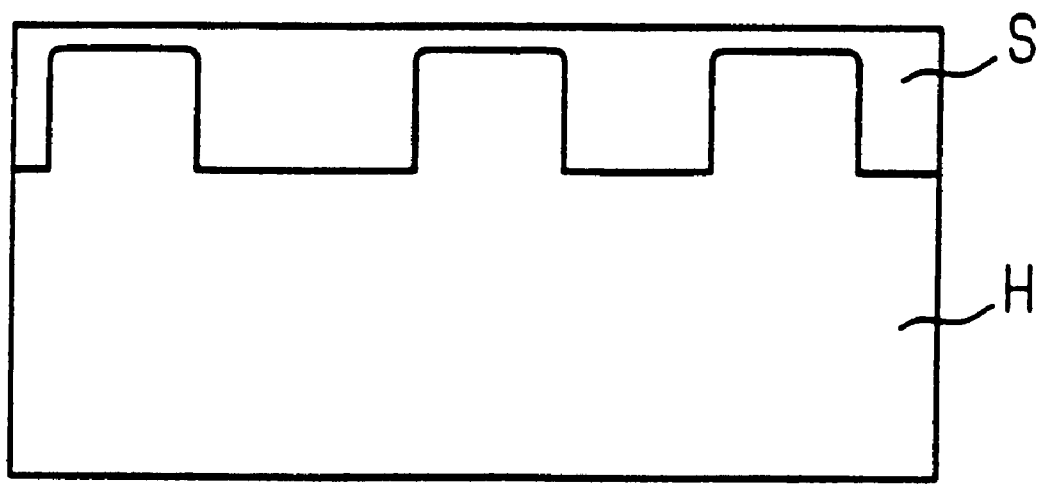
FIG. 9 is a sectional view taken along a line IX—IX of FIG. 2, in the direction of the arrows, for clarifying the position of the SAS resist mask within a memory cell array.

FIG. 9 shows a section of the completed source region S which is taken along a line IX—IX of FIG. 2.

Although the present invention has been described above by using preferred exemplary embodiments, it is not restricted to them, but rather can be modified in diverse ways.

By way of example, in a modification of the above-explained heat treatment step during the source doping (FIG. 7), as an alternative, the thermal budget for driving the phosphorus from the PSG layer 13 into the silicon substrate 2 can also be combined with flow processes of the intermediate oxide. In this case, the heat treatment step may be completely omitted, if appropriate.

We claim:

1. A method for fabricating a memory cell array, which comprises the following steps:
   a) burying insulation zones on a silicon substrate by applying STI (Shallow Trench Isolation) technology;
   b) forming word lines on the insulation zones;
   c) covering the word lines with a hard mask and side wall oxides;
   d) CVD depositing a material laterally onto the hard mask and onto the side wall oxides to define spacers;
   e) etching the spacers to form spacer channels in the insulation zones between adjoining word lines;
   f) applying and patterning an SAS (Self Aligned Source) resist mask to mask each two adjacent coated word lines in regions, including the spacer channel located between the word lines, while each two adjacent masked word lines of masked word line pairs remain unmasked in regions, including the spacer channel lying between the word lines;
   g) exposing the SAS resist mask;
   h) anisotropically etching regions of the insulation zones not covered by the SAS resist mask and lowering a bottom of uncovered spacer channels down at least to a surface of the silicon substrate;
   i) removing the SAS resist mask to uncover a resultant structure;
   j) depositing a PSG (phosphorus-doped glass) layer onto the uncovered structure; and
   k) heat treating a resultant structure to defuse the phosphorus doping into the uncovered silicon substrate as a source doping process step.

2. The method according to claim 1, which further comprises carrying out the CVD depositing step by selecting the material from the group consisting of an oxide and a nitride.

3. The method according to claim 2, which further comprises additionally including overetching in etching step h).

4. The method according to claim 2, which further comprises thinning the hard mask and the material selected from the group consisting of CVD oxide and nitride, in etching step h).

5. The method according to claim 2, which further comprises thinning the hard mask and the material selected from the group consisting of CVD oxide and nitride, in etching step h).

6. The method according to claim 1, which further comprises performing an aftertreatment step for the uncovered structure after step i) and before step j).

7. The method according to claim 1, which further comprises additionally including overetching in etching step h).

8. The method according to claim 7, which further comprises thinning the hard mask and the material selected from the group consisting of CVD oxide and nitride, in etching step h).

9. The method according to claim 1, which further comprises carrying out the heat treatment step k) in a furnace.

10. The method according to claim 9, which further comprises planarizing a resultant structure following step k).

11. The method according to claim 10, which further comprises carrying out the planarizing step by CMP.

12. The method according to claim 11, which further comprises performing a process for contact hole etching and filling and for metallization, following the planarizing step.

13. The method according to claim 10, which further comprises performing a process for contact hole etching and filling and for metallization, following the planarizing step.

14. The method according to claim 1, which further comprises carrying out the heat treatment step k) by RTA.

15. The method according to claim 14, which further comprises planarizing a resultant structure following step k).

16. The method according to claim 15, which further comprises carrying out the planarizing step by CMP.

17. The method according to claim 16, which further comprises performing a process for contact hole etching and filling and for metallization, following the planarizing step.

18. The method according to claim 15, which further comprises performing a process for contact hole etching and filling and for metallization, following the planarizing step.

19. The method according to claim 1, which further comprises planarizing a resultant structure following step k).

20. The method according to claim 19, which further comprises carrying out the planarizing step by CMP.

21. The method according to claim 20, which further comprises performing a process for contact hole etching and filling and for metallization, following the planarizing step.

22. The method according to claim 19, which further comprises performing a process for contact hole etching and filling and for metallization, following the planarizing step.

* * * * *